United States Patent [19]
Miyakuni et al.

[11] Patent Number: 5,370,767
[45] Date of Patent: Dec. 6, 1994

[54] SELECTIVE DRY ETCHING METHOD FOR COMPOUND SEMICONDUCTOR AND PRODUCTION METHOD OF SEMICONDUCTOR DEVICE

[75] Inventors: Shinichi Miyakuni; Takesi Kuragaki, both of Itami, Japan

[73] Assignee: Mitsubishi Denki Kabushiki Kaisha, Tokyo, Japan

[21] Appl. No.: 125,832

[22] Filed: Sep. 24, 1993

[30] Foreign Application Priority Data

Mar. 26, 1993 [JP] Japan ................................. 5-067265
Sep. 10, 1993 [JP] Japan ................................. 5-225673

[51] Int. Cl.$^5$ ..................... H01L 21/306; B44C 1/22
[52] U.S. Cl. .................................. 156/643; 156/655; 156/659.1; 156/662; 252/79.1; 437/234
[58] Field of Search ............... 156/643, 655, 659.1, 156/662; 252/79.1; 204/192.32; 437/225, 234, 96, 104, 126

[56] References Cited

U.S. PATENT DOCUMENTS 5,024,958  6/1991  Awano .................... 156/649

OTHER PUBLICATIONS

Kosugi et al, "Selective Photochemical Dry Etching Of GaAs/AlGaAs And InGaAs/InAlAs Heterostructures", Electronics Letters, vol. 27, No. 23, Nov. 1991, pp. 2113–2114.

Miyakuni et al, "Low Damage Etching Of InGaAs/AlGaAs By the ECR Plasma With $Cl_2$/He Mixture For HBTs", 19th International Symposium on Gallium Arsenide and Related Compounds, Oct. 1992.

Primary Examiner—William Powell
Attorney, Agent, or Firm—Leydig, Voit & Mayer

[57] ABSTRACT

A selective ECR dry etching method for etching compound semiconductors includes dry etching an In-containing compound semiconductor material in an ECR plasma of a $Cl_2$/He mixture with a $Cl_2$/(He+$Cl_2$) ratio from 0.05 to 0.2 and a gas pressure below $4.0 \times 10^{-4}$ Torr. A selective ECR dry etching method includes dry etching a compound semiconductor material including no Al selectively with respect to a compound semiconductor material including Al using a plasma in an $Cl_2$/He/$O_2$ mixture with a ratio of $Cl_2$/(He+$Cl_2$) ratio within 0.05 to 0.2 and $O_2$ less than 30% of the $Cl_2$ gas at a gas pressure below $5.0 \times 10^{-4}$ Torr.

6 Claims, 13 Drawing Sheets

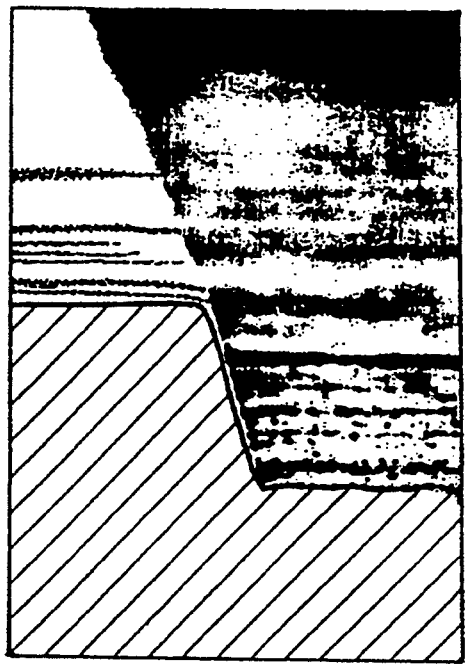
Fig.8(a)  P~2.0×10⁻⁴Torr
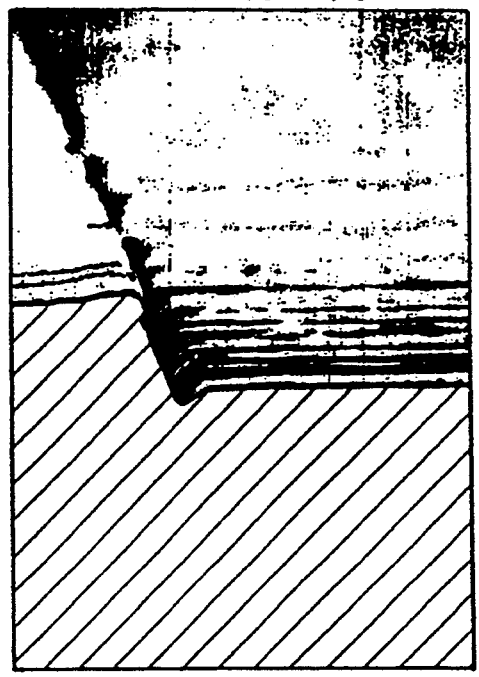
Fig.8(b)  P~7×10⁻⁴Torr

InGaAs/AlGaAs structure

GaAs/AlGaAs structure

SELECTIVE DRY ETCHING METHOD FOR COMPOUND SEMICONDUCTOR AND PRODUCTION METHOD OF SEMICONDUCTOR DEVICE

FIELD OF THE INVENTION

The present invention relates to a selective dry etching method for compound semiconductors and, more particularly, to an etching method that effectively dry etches compound semiconductors $Cl_2/He$ mixture or a $Cl_2/He/O_2$ mixture, and further a method of producing a semiconductor device having an InGaAs layer as a contact layer of an ohmic electrode.

PRIOR ART

AlGaAs/GaAs series heterojunction bipolar transistors (hereinafter referred to as "HBT") have super high speed and high current driving ability and have been developed for many fields. HBTs have superior performance in a super high speed digital IC or a high efficiency and high output power amplifier. The fundamental structure of an HBT is represented in table 1.

TABLE 1

|   | composition | doping (cm$^{-3}$) | layer thickness (nm) | AlAs or InAs composition ratio (x) |
| --- | --- | --- | --- | --- |
| emitter contact | n$^+$ InGaAs | 4E19 | 50 | 0.5 |
|  |  |  | 50 | 0~0.5 |
| emitter | n AlGaAs | 5E17 | 30 | 0.3~0 |
|  |  |  | 90 | 0.3 |
|  |  |  | 30 | 0.1~0.3 |
| base | p$^+$ AlGaAs | 4E19 | 100 | 0~0.1 |
| collector | n GaAs | 5E16 | 500 | — |
| collector contact | n$^+$ GaAs | 5E18 | 500 | — |

In order to improve the emitter mesa formation process which is an important technique in enhancing the performance of an HBT dry etching having high controllability is required in place of wet etching that lacks reproducibility. However, there is a problem in that conventional etching utilizing RIE and RIBE deteriorates the device characteristics due to the damage caused by high energy ions. In addition, it is reported that a good morphology is obtained by employing $CH_4/H_2$ gas in contrast to a case where the etching is performed by $Cl_2$ gas for In series compound such as InGaAs. In this case, however, there is a serious problem that the deactivation of carriers occurs due to hydrogen.

That is, conventionally, etching is performed by RIE (Reactive Ion Etching) or RIBE (Reactive Ion Beam Etching) using chlorine series gas or hydrogenated carbon series gas in the etching of In series compound semiconductor. In these methods, however, the energy of ions incident on to the material to be etched is high and the damage to the In series compound semiconductor is large. Especially when chlorine series gas is used, it is difficult to obtain a good configuration of surface morphology of the In series compound semiconductor etched. In addition, when etching is performed using hydrogenated carbon series gas, it is possible to obtain a good configuration surface morphology of the In series compound semiconductor material etched. However, when it is applied to an actual device, because a hydrogenated carbon series gas is used, there arises deactivation of carriers due to hydrogen.

In addition, for selective dry etching of GaAs/AlGaAs heterostructures, chlorine series/fluorine series mixtures such as $SF_6/Cl_2$, $SiF_4/SiCl_4$ have been used. In addition, for selective dry etching of InGaAs/InAlAs heterostructures, photoetching using $CH_3Br$ gas is devised and there is no selective etching using plasma etching.

FIG. 15 shows a cross sectional view of respective processes in a prior art production method. In FIG. 15, reference numeral 21 designates a semi-insulating GaAs substrate. An undoped GaAs layer 22 is disposed on the semi-insulating GaAs substrate 21. An n type AlGaAs layer 23 is disposed on the n type AlGaAs layer 23. An n type InGaAs layer 24 is disposed on the n type AlGaAs layer 23. Reference numeral 25 designates first photoresist, and reference numeral 26 designates second photoresist. Source and drain electrodes 27 are disposed on the n type InGaAs layer 24. A gate electrode 28 is disposed in a recess produced in the n type AlGaAs layer 23. Reference numeral 29 designates a roughness generated at the bottom when the InGaAs layer 24 is etched.

A production process will be described in the following.

First of all, on semi-insulating GaAs substrate 21 an undoped GaAs layer 22, n type AlGaAs layer 23, n type InGaAs layer 24 are successively produced by MOCVD (metal organic chemical vapor deposition). Then, because InGaAs layer 24 does not lattice match with GaAs layer 22 and AlGaAs layer 23, the morphology of the surface is deteriorated. Thereafter, first photoresist 25 is deposited and patterned as shown in FIG. 15(a).

Next, using the first photoresist 25 as a mask, dry etching using Cl series gas or wet etching using, for example, succinic acid and hydrogen peroxide is performed to etch the InGaAs layer 24 (FIG. 15(b)). Then, since the InGaAs layer 24 and the n type AlGaAs layer 23 have no significant difference in the etching rate, the surface of the n type AlGaAs layer 23 exposed after etching becomes rough. Thereafter, the n type AlGaAs layer 23 is etched by dry etching using $Cl_2$ series gas or wet etching using, for example, $NH_4OH: H_2O_2$, thereby producing a recess 30 (FIG. 15(c)).

Next, the first photoresist 25 is removed (FIG. 15(d)), the second photoresist 26 is deposited, and it is patterned(FIG. 15(e)).

Next, by evaporating a metal that produces a Schottky junction with an type AlGaAs layer 23, for example, Ti/Mo/Au is evaporated and lifted off, thereby producing a source and a drain electrode 27, and further producing a gate electrode 28 in the recess 30. Then, the gate electrode 28 is produced on the etched bottom surface 29 that has become rough (FIG. 15(f)).

Thereafter, a predetermined process is carried out to produce a semiconductor device.

In the above example, the source and the drain electrode 27 and the gate electrode 28 are produced at the same time by the same multi-layer metal film, but these may be produced from different metal films, respectively, by separate processes.

As described above, in the prior art method for etching an In series compound semiconductor, it was difficult to etch the In series compound semiconductor to have good surface the morphology with low damage.

Furthermore, it was also difficult to selectively dry etch the upper layer compound semiconductor including no Al relative to a lower layer compound semiconductor including Al by a unified method.

Furthermore, in the prior art production method, the roughness of the surface due to the lattice mismatching of an InGaAs layer with a GaAs layer and an AlGaAs layer remains at the bottom after the etching, and the electrode formed on the rough surface causes deterioration of the device characteristics. In addition, it is necessary to improve the morphology of InGaAs layer so as to reduce the roughness of the etching surface, thereby resulting in problems in that it is not preferable to make the In composition larger than 0.5 and that the growth temperature is subjected to restrictions.

SUMMARY OF THE INVENTION

It is an object of the present invention to provide a selective etching method of In series compound semiconductors that enables a etching of that material that provides good surface.

It is another object of the present invention to provide a selective dry etching method that etches an upper layer compound semiconductor layer including no Al selectively relative to a lower layer compound semiconductor including Al with high selectivity.

It is a still another object of the present invention to provide a production method of semiconductor device that enables the In composition of an InGaAs layer to be larger than 0.5 and causes no roughness of an etched bottom surface where an electrode is to be produced.

Other objects and advantages of the present invention will become apparent from the detailed description given hereinafter; it should be understood, however, that the detailed description and specific embodiment are given by way of illustration only, since various changes and modifications within the scope of the invention will become apparent to the those skilled in the art from this detailed description.

According to a first aspect of the present invention, a selective dry etching method for compound semiconductors includes, employing an ECR etching apparatus, performing dry etching to of an In series compound semiconductor employing a $Cl_2/He$ mixture, the $Cl_2/(He+Cl_2)$ ratio of which is within 0.05 to 0.2 and the gas pressure of which is below $4.0 \times 10^{-4}$ Torr.

Therefore, etching of an In series compound semiconductor that has good surface morphology and low damage is achieved.

According to a second aspect of the present invention, a selective dry etching method for a compound semiconductor includes, employing an ECR etching apparatus and, employing $Cl_2/He/O_2$ mixture gas that is obtained by diluting $Cl_2$ gas with He gas more than 4 times to make the ratio of $Cl_2/(He+Cl_2)$ within 0.05 to 0.2, adding $O_2$ gas in an amount below 30% of the $Cl_2$ gas to the mixed gas, and setting the gas pressure of the gas below $5.0 \times 10^{-4}$ Torr, dry etching to an upper layer compound semiconductor including no Al selectively with respect to a lower layer compound semiconductor including Al.

Therefore, an etching having high selectivity with a lower layer compound semiconductor including Al is enabled.

According to a third aspect of the present invention, a method of producing a field effect transistor having a structure in which an AlGaAs layer having an Al composition ratio of 0.2 or more and an InGaAs layer having an In composition ratio of 0.5 or more successively deposited on an active layer comprising GaAs, includes etching the InGaAs layer selectively with respect to the AlGaAs layer by reactive plasma etching employing an etching gas including at least chlorine and oxygen; and etching the AlGaAs layer employing the InGaAs layer as a mask employing, thereby producing a recess.

Therefore, an electrode can be produced on a smooth etched surface of n type InGaAs layer having an In concentration ratio above 0.5. Then, problems that the In composition must be restricted to below 0.5 and that the growth temperature is subjected to restrictions so as to lower the roughness of the etched surface and improve the surface morphology of InGaAs layer, do not arise.

BRIEF DESCRIPTION OF THE DRAWINGS

FIG. 2(a) is that case where $Cl_2$ gas flow is 10 SCCM and RF power is 20 W, and FIG. 2(b) is that case where $Cl_2/He$ is 1/9 SCCM and RF power is 20 W.

FIGS. 8(a) and 8(b) are diagrams showing the InGaAs etching configuration under a gas pressure below 0.2 mTorr and the etching configuration under a gas pressure of below 0.7 mTorr according to the first embodiment, respectively.

DETAILED DESCRIPTION OF THE PREFERRED EMBODIMENT

Embodiment 1

When III-V group compound semiconductor including In is etched with a chlorine series gas, $InCl_x$ (x=1-3) having a non-volatile property is produced at its surface, and therefore the etching becomes quite difficult. In order to promote the desorption of these etching products, physical sputtering employing high energy ions and substrate temperature rising have been studied in etching methods using RIE and RIBE. However, these methods have a problem of damage due to the etching. Therefore, the present inventor examined the conditions that enable etching of InGaAs with a low ion energy while balancing the generation and desorption of $InCl_x$. In order to realize these conditions, it is thought effective to reduce the supply of etchant reaching the substrate so as to suppress the generation of extra $InCl_x$. As a method satisfying this condition, dilution of $Cl_2$ gas with an inactive gas such as He was thought of.

The present invention provides a selective dry etching method of In series compound semiconductor that performs an etching of that material, employing an ECR etching apparatus and further employing $Cl_2$/He mixture gas that is obtained by diluting $Cl_2$ gas with He gas by more than 4 times to obtain a value of $Cl_2/(He+Cl_2)$ ratio within 0.05 to 0.2 and making the gas pressure below $4.0 \times 10^{-4}$ Torr.

The experiment of this first embodiment of the present invention utilizes InGaAs as a typical example of In series compound semiconductor and etching concerning this semiconductor is examined.

Figure 1:
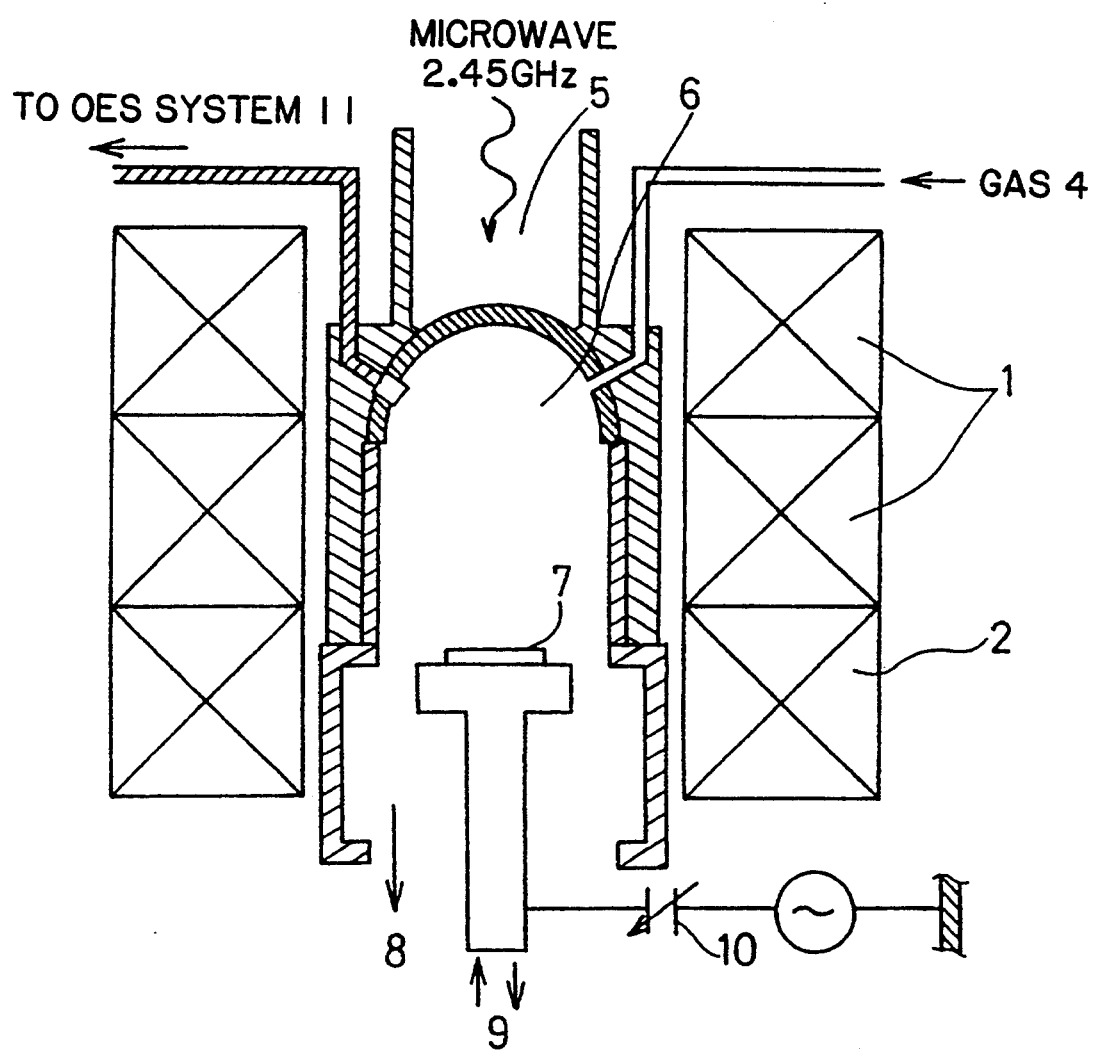
FIG. 1 is a diagram illustrating an ECR etching apparatus used in a first embodiment of the present invention.

FIG. 1 illustrates an ECR etching apparatus used in this first embodiment. In the figure, reference numeral 1 designates a main magnetic coil and reference numeral 2 designates an auxiliary magnetic coil. Reference numeral 5 designates a quartz window, reference numeral 6 designates a plasma room, reference numeral 7 designates a wafer, reference numeral 8 designates vacuum exhausted gas, reference numeral 9 designates a cooling water, and reference numeral 10 designates an RF oscillator (13.56 MHz).

This ECR etching apparatus has a main magnetic coil 1 and an auxiliary magnetic coil 2, and by using the auxiliary magnetic coil 2, the divergence of the main magnetic field produced by the main magnetic coil 1 is controlled so as to lower the magnetic field gradient in the magnetic force line direction. Therefore, an ion current density uniform in the radius direction of the apparatus is obtained. The oscillation frequency of the microwave introduced to this apparatus is 2.45 GHz, and the ECR resonance magnetic field produced in the plasma room 6 is 875 G. To the substrate holder holding the wafer 7, an RF bias of 13.56 MHz can be applied by the RF oscillator 10, and thereby the ion energy incident to the substrate 7 is varied.

Figure 2A:
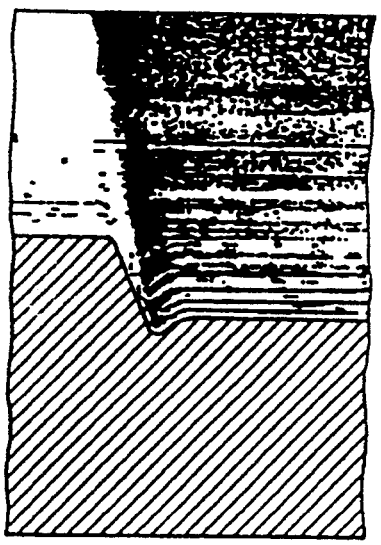
FIGS. 2(a) and 2(b) are diagrams showing a cross sectional configuration of a structure when a $In_xGa_{1-x}As$ (x=0.16) layer on a GaAs substrate is etched using the ECR apparatus, where

As experimental samples for the wafer 7, $In_xGa_{1-x}As$ (x=0.16) grown on a semi-insulating GaAs substrate of 3 inch diameter by molecular beam epitaxy (hereinafter referred to as "MBE") (FIG. 2(a) and FIG. 2(b)) and $In_xGa_{1-x}As$ (x=0.53) grown on a In substrate (FIG. 3) by MBE are employed. As an etching mask, WSi of 3000 Å thickness is employed. For the etching a, $Cl_2$/He mixture that is obtained by diluting $Cl_2$ gas with He gas more than 4 times and at respective partial pressures below $2.0 \times 10^{-4}$ Torr (totally the gas pressure is 0.4 mTorr) is employed. The intensity of the main magnetic field and the auxiliary magnetic field are respectively set to 15 A and 23 A, as a condition that the ion current density in the radius direction be uniform. The power of the microwave energy (2.45 GHz) is kept constant at 200 W and the RF power of the RF oscillator (13.56 MHz) is varied within 0 to 20 W. The temperature of the substrate holder 7 is kept constant at room temperature.

In order to investigate the relation between the etching characteristics and the plasma kind in the etching, OES (Optical Emission Spectrometry) is employed, and AES (Auger Emission Spectrometry) is employed for element analysis of the surface attached material after the etching. As for the damage induced by the etching, an evaluation is performed from the Raman scattering spectrum.

Figure 4A:
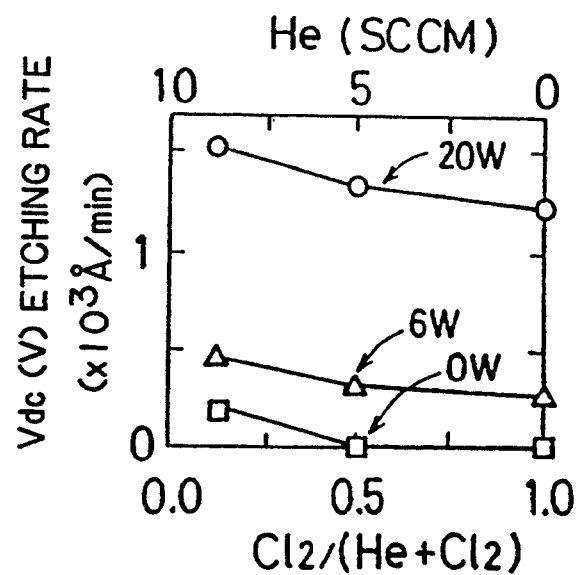
FIG. 4 is a diagram showing the $Cl_2/(He+Cl_2)$ ratio dependency of the InGaAs etching speed and DC bias in a case where the RF power is varied in etching of an In series compound semiconductor according the first embodiment.
Figure 4B:
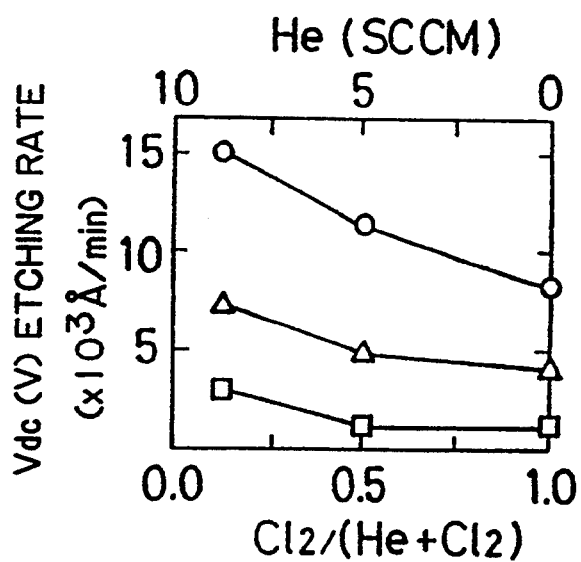

FIG. 4 shows the $Cl_2/(He+Cl_2)$ ratio dependency of the etching speed of $In_xGa_{1-x}As$ (x=0.16) with DC bias voltage $V_{dc}$ for three different RF powers as parameters. The experiment is performed on a condition that the gas pressure is below 0.5 mTorr and the total gas flow quantity is constant at 10 SCCM. The substrate surface temperature during etching is 80° C.

It is found from the figure that in a state where no RF power is applied to the substrate, no etching is performed by $Cl_2$ alone, i.e., when $Cl_2/(He+Cl_2)$ ratio is 1.0, but as the $Cl_2$ gas is diluted with He gas, that is, as the $Cl_2/(He+Cl_2)$ ratio decreases, etching is enabled even under a low DC bias voltage $V_{dc}$ of about 3 V. In addition, with an increase of RF power, that is, when the RF power becomes 0 W, 6 W, 20 W, etching becomes possible with only $Cl_2$ gas, but abnormal etching under the WSi mask becomes apparent. This is illustrated by etching of the GaAs substrate in a triangle configuration in the vicinity of the surface below the WSi mask which corresponds to a white portion in the FIG. 2(a), a cross-sectional SEM photograph, where $Cl_2$: 10 SCCM and RF power: 20 W. On the contrary, when the etching is performed using a $Cl_2$/He mixture that is obtained with diluting $Cl_2$ by He by more than 4 times to make the $Cl_2/(He+Cl_2)$ ratio 0.05 to 0.2 and making the partial pressure of respective gases below $2.0 \times 10^{-4}$ Torr (the total gas pressure is below 0.4 mTorr), abnormal etching is improved and an etching configuration of good surface morphology is obtained. This is shown in the cross sectional SEM photograph of FIG. 2(b) where $Cl_2$/He is 1/9 SCCM and RF power is 20 W.

Figure 5:
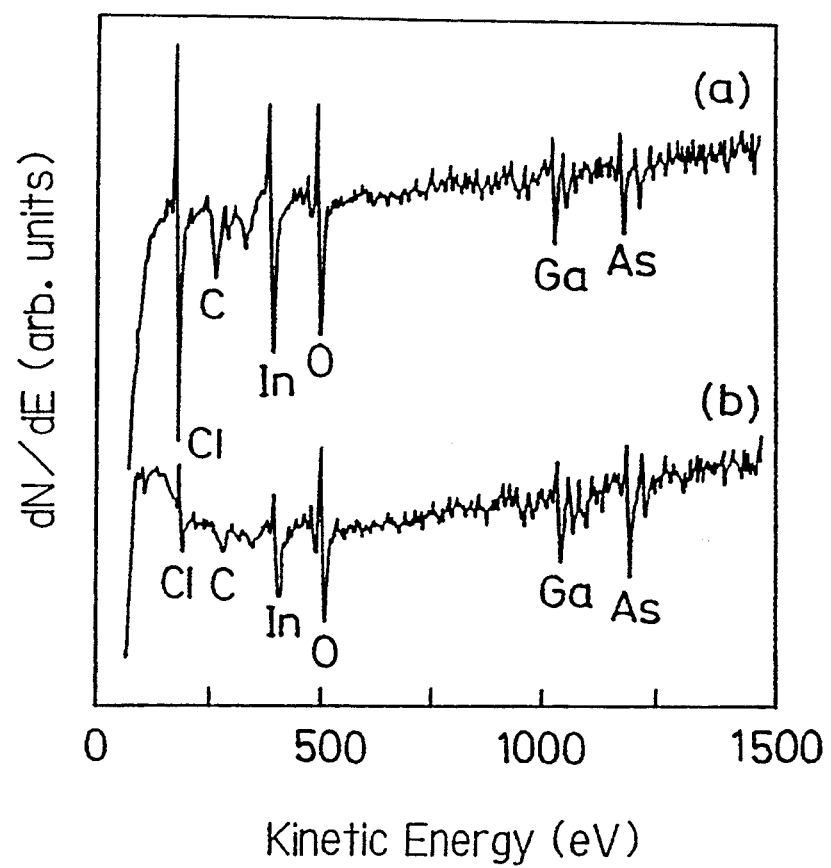
FIG. 5 is a diagram showing the result of the analysis of the surface attached material employing AES for the unetched state (line (a)) [$Cl_2/He$: 10/0 SCCM, RF power: 0 W] and the state of good surface morphology (FIG. 5(b)) [$Cl_2/He$: 1/9 SCCM, RF power: 20 W].

FIG. 5 shows the result of the element analysis of the surface attached material using AES on two different conditions, i.e., a state (a) where no etching is performed [$Cl_2$/He: 10/0 SCCM, RF power: 0 W] and a state (b) of good surface morphology [$Cl_2$/He: 1/9 SCCM, RF power: 20 W]. From the surface where no etching is performed, Cl 5 times that of (b) is detected. Furthermore, a lot of In is detected from (a). These results show that the generation of extra $InCl_x$ obstructs the etching, and regulating the supply speed of $Cl_2$, that is, the state of controlling the $Cl_2$ gas quantity supplied to the chamber, is required for the etching of InGaAs.

Figure 2B:

Next, InGaAs grown on a GaAs substrate by MBE has rough surface because of lattice mismatching and the cause of the roughness on the substrate in the state of FIG. 2(b) cannot be attributed to the rough surface of InGaAs laminated on GaAs substrate or etching.

Figure 3:
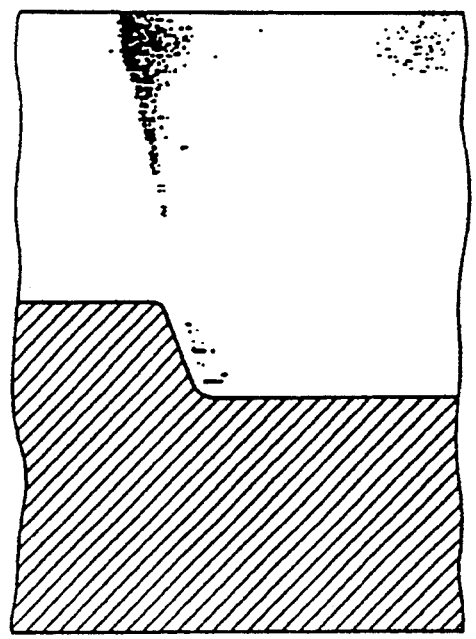
FIG. 3 is a diagram showing a cross sectional configuration when an $In_xGa_{1-x}As$ (x=0.53) layer on an InP substrate is etched using an ECR apparatus, in a case where $Cl_2/He$ is 1/9 SCCM and RF power is 20 W.

In order to clarify this, FIG. 3 shows a cross sectional SEM photograph where etching is performed under the same conditions as that in FIG. 2(b) for InP grown on an InP substrate by MBE with good lattice matching. From this FIG. 3, when $In_xGa_{1-x}As$ (x=0.53) grown on InP substrate is etched on a condition that the $Cl_2$/He mixture ratio is 1/9, a smooth etching surface is obtained, and the etching is performed cleanly. Also from this result, the roughness of the etched surface of GaAs seen in FIG. 2(b) is considered due to the InGaAs grown on GaAs in a lattice mismatched state.

Figure 6:
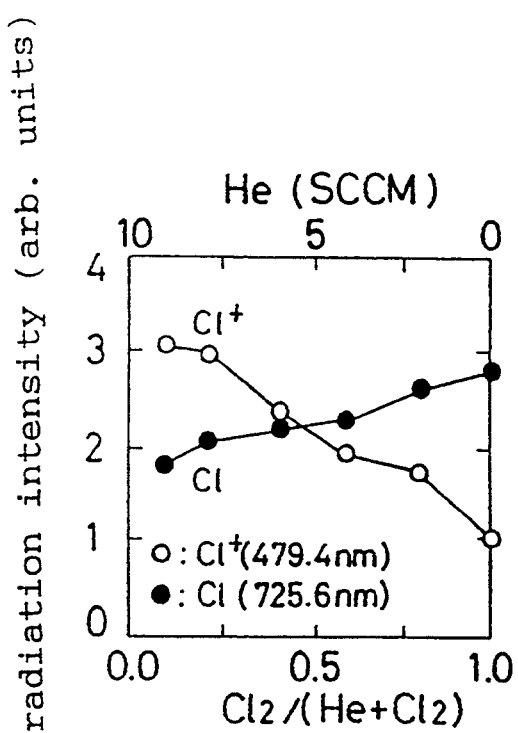
FIG. 6 is a diagram showing the $Cl_2/(He+Cl_2)$ ratio dependency of the Cl atom.Cl ion light emission intensity ratio according to the first embodiment.

FIG. 6 shows a result of investigation employing Optical Emission Spectroscopy showing that the Cl atoms (Cl) and Cl ions (Cl+) in the etching vary as a function of the $Cl_2/(He+Cl_2)$ ratio. As the light emission wavelengths of Cl atoms and Cl ions, 725.6 nm and 479.4 nm are respectively detected. As it is diluted with He, the light emission intensity of Cl atoms (Cl) is reduced and the light emission intensity of Cl ions (Cl+) increases to about three times when this ratio is 1/9 relative to the intensity when the $Cl_2/(He+Cl_2)$ ratio is 1.0. This phenomenon is thought to be caused by the Penning effect and due to collisions of He excited in the discharging gas, the ionization of Cl (Cl+) is intensified. This result shows that the addition of He has an effect of not simply diluting $Cl_2$ gas but an effect of selectively increasing Cl ions (Cl+) with Cl atoms (Cl).

Figure 7:
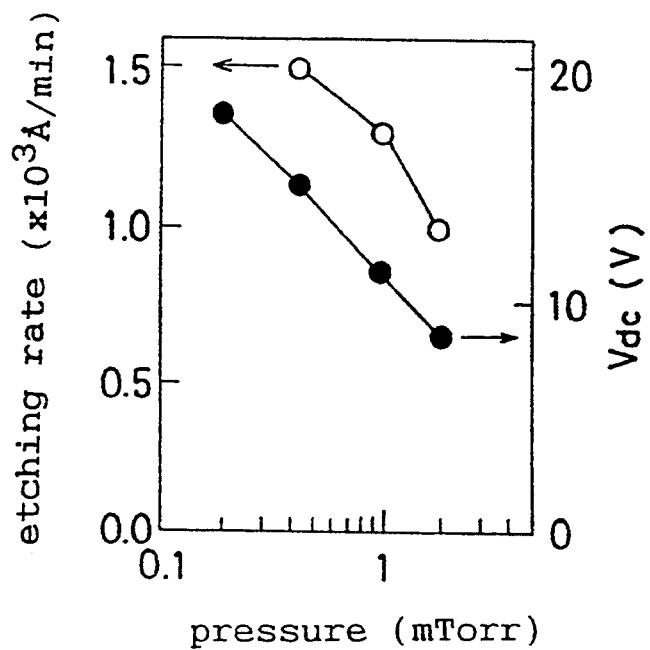
FIG. 7 is a diagram showing the gas pressure dependency of the InGaAs etching speed and DC bias according to the first embodiment.

FIG. 7 shows the result of an investigation of the gas pressure dependency of the etching speed of $In_xGa_{1-x}As$ (x=0.16) and of the DC bias voltage $V_{dc}$. The experiment is performed on a condition of $Cl_2$/He mixture ratio: 1/9 and RF power: 20 W. For an increase of the pressure, the etching rate and DC bias $V_{dc}$ are both reduced and normal etching appears as shown in FIG. 8(a) at 0.2 mTorr of gas pressure while abnormal etching is seen as shown in FIG. 8(b) in a gas pressure above 0.5 mTorr, for example, 0.7 mTorr.

Figure 9:
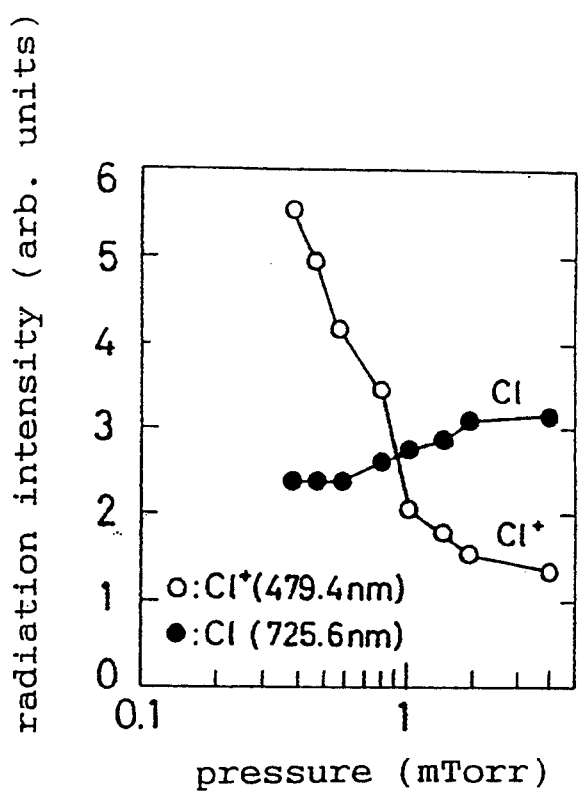
FIG. 9 is a diagram showing the gas pressure dependency of the Cl atom.Cl ion light emission intensity ratio according to first embodiment.

FIG. 9 shows the light emission intensity of Cl atoms (Cl) and Cl ions (Cl+) as a function of gas pressure. From this figure, it is found that with the increase of the pressure, the light emission intensity of Cl ions (Cl+) abruptly reduced when the gas pressure increases to above 0.4 mTorr (the respective partial pressures of $Cl_2$ gas and He gas are both $2.0 \times 10^{-4}$ Torr or more) and the light emission intensity of Cl atoms (Cl) gradually increases. These results show that it is effective in etching InGaAs to reduce Cl atoms (Cl) and increase Cl ions (Cl+) at a low gas pressure (below 0.4 mTorr).

In order to evaluate the damage induced in the crystal surface by ECR etching InGaAs on a condition that the above-described $Cl_2$/He mixture ratio is 1/9, measurements of Raman scattering spectrum and base electrode contact resistance are performed. From the result of evaluation employing this Raman scattering spectroscopy, it is found that only quite low damages caused and this will be described in the following.

Figure 10:
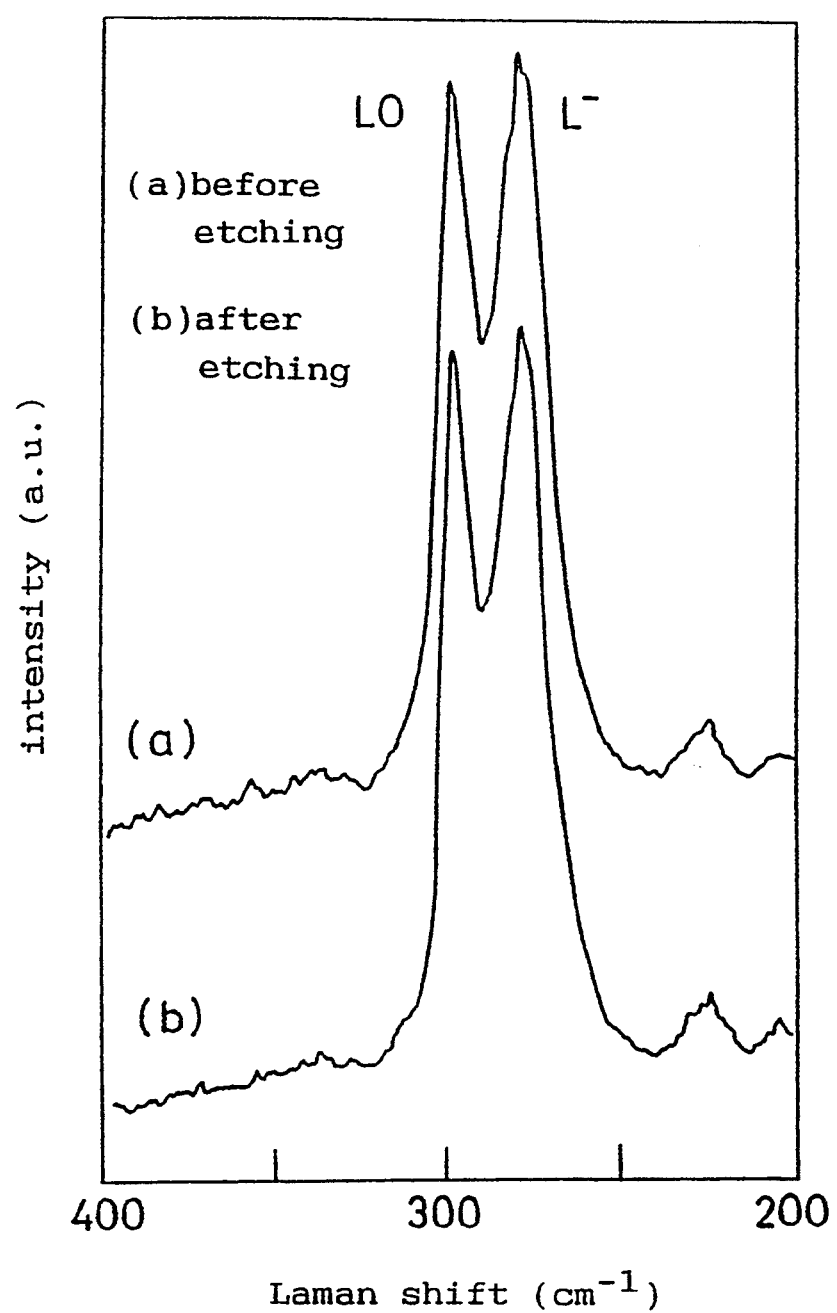
FIG. 10 is a diagram showing the Raman spectrum as a result of an evaluation employing a Raman scattering method for the damage induced at the crystal surface by the ECR etching according to the first embodiment, line (a) shows that before etching and line (b) shows that after etching.

The Raman scattering spectroscopy investigates the surface state of a crystal by analyzing the excited light of frequency $v$. An evaluation is also performed on the change of the surface depletion layer thickness after etching and based on crystallinity. As an excitation light source, an Ar laser of wavelength of 4880 Å is used. As an evaluation sample, in order to investigate the state of the uppermost surface of the crystal (several hundreds Å), an n type GaAs substrate ($n \sim 1.5 \times 10^{18}$ cm$^{-3}$) having a thin depletion layer ($\sim 300$ Å) is used and is etched with a $Cl_2$/He gas flow of: 2.5/17.5 SCCM, gas pressure: 0.4 mTorr, and RF power: 20 W (DC bias: 20 V). The results are compared to another sample which is not etched. FIG. 10 shows the result of Raman spectrum, where line (a) represents before etching and line (b) represents the spectrum after etching.

The change in the depletion layer thickness as a result of the etching can be estimated from the peak intensity ratio (ILO/IL—) between LO phonon (uncoupled longitudinal optical phonon) and L-phonon (coupled plasmon —LO phonon), and because no significant difference is seen from the result after measuring the intensity ratio, there is no change in the depletion layer thickness before and after the etching. As a result of measuring the broadening of the half value width of LO-phonon by the Lorentzian fitting method, no broadening of the half value width is observed, and it can be thought that there has been no deterioration of crystallinity at the substrate surface layer due to the etching.

The contact resistance of the electrode produced on the base surface that is dry etched is measured and compared with one that is produced by wet etching. As a base electrode, an Au/Mo/Ti structure (non-alloy ohmic contact) is used. From the measurement result, $2 \times 10^{-6}$ $\Omega \cdot cm^2$ is obtained as the mean base contact resistance. This value is approximately the same as the value that is obtained by wet etching.

These results show that the etching is by quite low.

From the above-described results, in order to achieve good surface morphology and low damage etching of InGaAs, (1) carry out low energy ion etching employing an ECR etching apparatus, (2) use a $Cl_2$/He mixture that is obtained by diluting $Cl_2$ gas with He gas to make the $Cl_2/(He+Cl_2)$ ratio 0.05 to 0.2, (this ratio has 0.05 as the lower limit because the concentration is too high at a ratio below 0.05, thereby causing plasma discharge which is required for etching), and (3) make the gas pressure less than 0.4 mTorr (partial pressures of $Cl_2$ and He below 0.2 mTorr).

As described above, according to a selective dry etching method of a first embodiment of the present invention, by employing ECR etching and employing $Cl_2$/He mixture with a $Cl_2/(He+Cl_2)$ ratio within 0.05 to 0.2 and a gas pressure below $4.0 \times 10^{-4}$ Torr, etching of an In series compound semiconductor having good surface morphology and low damage is achieved.

Embodiment 2

A second embodiment of the present invention that performs a selective dry etching of InGaAs/AlGaAs, and a GaAs/AlGaAs heterostructure will be described.

First of all, an experiment according to this embodiment will be described.

An ECR etching apparatus shown in FIG. 1 is used for the experiment. The ECR etching apparatus has a main magnetic field coil 1 and an auxiliary magnetic field coil 2, and by using the auxiliary magnetic field coil 2, it is possible to control the divergence of the main magnetic field produced by the main magnetic field coil 1 so as to reduce the magnetic field gradient in the magnetic force line direction, and thereby to make the ion current density uniform in the radius direction of the apparatus, as in the first embodiment. Further, the oscillation frequency of the microwaves introduced into this apparatus is 2.45 GHz, the ECR resonance magnetic field produced in the plasma room 6 is 875 G, an RF bias of 13.56 MHz is applied to the substrate holder holding the wafer 7 by an RF oscillator 10, and thereby the ion energy incident on the substrate 7 can be changed, as in the first embodiment.

The experimental sample used herein is one comprising $In_xGa_{1-x}As$ (x=0.16)/$Al_xGa_{1-x}As$ (x=0.30) grown on a semi-insulating GaAs substrate of 3 inch diameter. For the etching of this heterostructure, a mixture of $Cl_2/He/O_2$ that is obtained with diluting $Cl_2$ gas by He more than 4 times, adding $O_2$ gas in an amount below 30% of $Cl_2$ gas thereto, and keeping the gas pressure below $5.0\times10^{-4}$ Torr, is employed. The microwave power is kept constant at 200 W and the RF power is varied from 10 to 40 W. The temperature of the substrate holder is made constant at room temperature.

Figure 11:
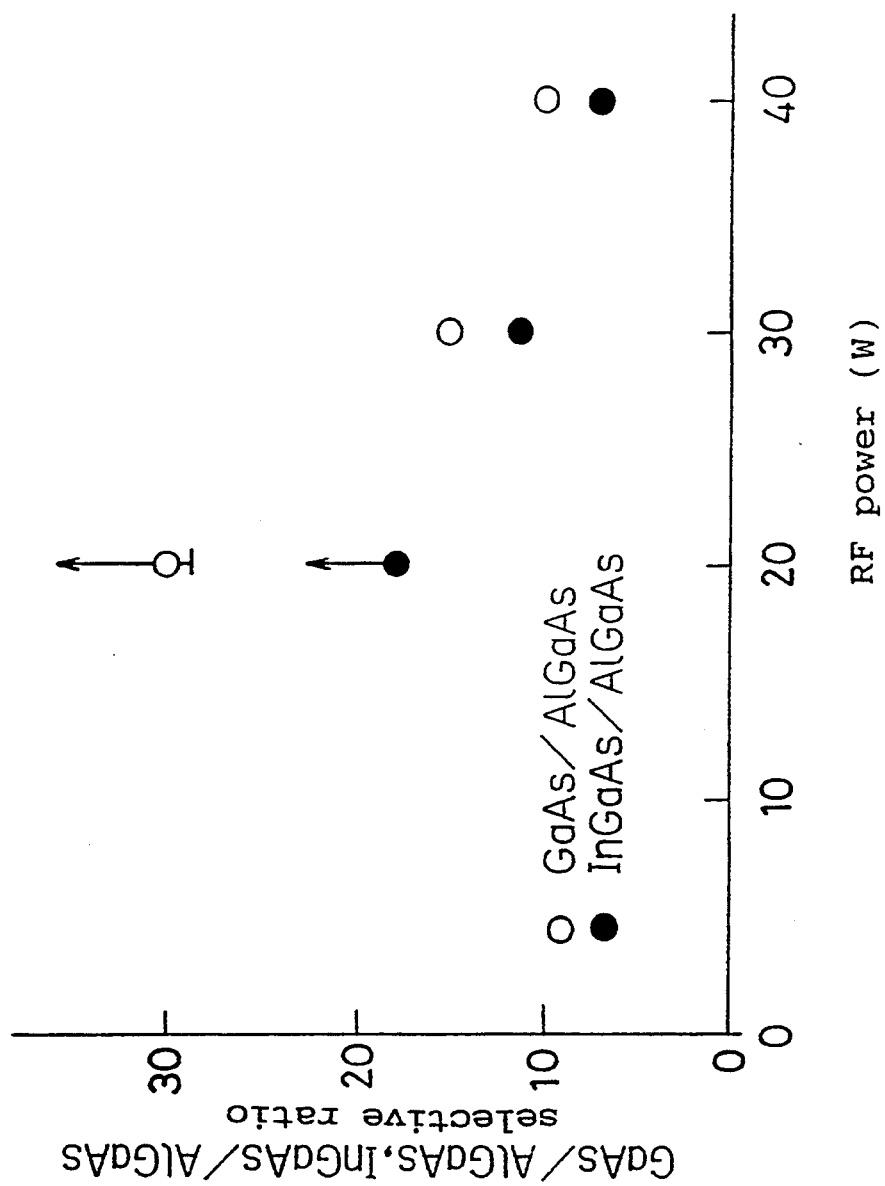
FIG. 11 is a diagram showing the RF power dependency of the selectivity ratio of InGaAs/AlGaAs and GaAs/AlGaAs where $In_xGa_{1-x}As$ (x=0.16), $Al_xGa_{1-x}As$ (x=0.30), and GaAs are employed as materials according to a second embodiment of the present invention.

FIG. 11 shows the RF power dependency of selectivity ratio of InGaAs/AlGaAs, GaAs/AlGaAs employing $In_xGa_{1-x}As$ (x=0.16), $Al_xGa_{1-x}As$ (x=0.30), and Ga as material. The gas flow quantity is made constant at $Cl_2/O_2/He$: 2.0/0.6/18.0 SCCM. In this etching, although the selectivity is reduced with the increase of RF power, when RF power is 20 W, AlGaAs is almost not etched, and quite high values of selectivity, that is, respectively larger than 18 and 30 are obtained for InGaAs/AlGaAs, GaAs/AlGaAs.

Figure 12A:
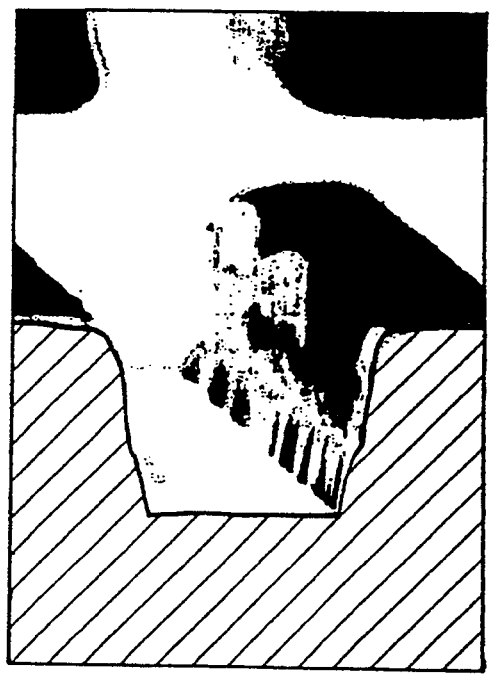
FIGS. 12(a) and 12(b) are perspective views showing selectively etched configurations of the InGaAs/Al- GaAs structure (FIG. 12(a)) and GaAs/AlGaAs structure (FIG. 12(b)), respectively.
Figure 12B:
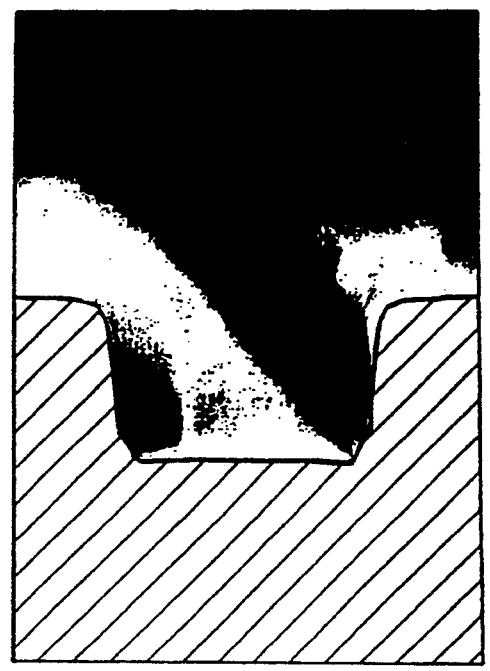

FIGS. 12(a) and 12(b) show selectively etched configurations of an InGaAs/AlGaAs structure (FIG. 12(a)) and an GaAs/AlGaAs structure (FIG. 12(b)), respectively.

Figure 13:
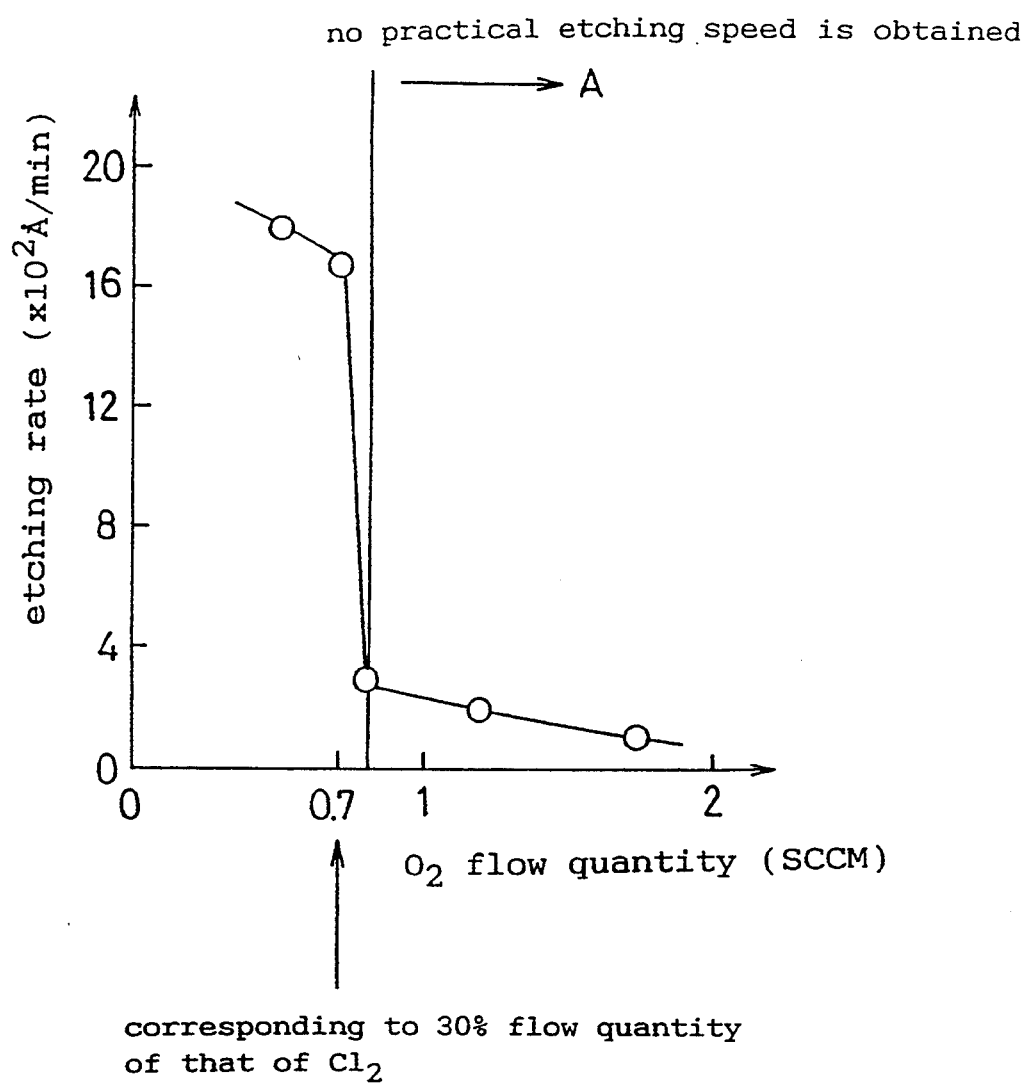
FIG. 13 is a diagram showing the $O_2$ addition amount dependency of the GaAs etching speed.

FIG. 13 shows an $O_2$ addition amount dependency of GaAs etching speed, and the etching condition is $Cl_2/He$: 2.0/17.0 SCCM, 0.45 mTorr, microwave power: 200 W, and RF power: 40 W. From FIG. 13, when the $O_2$ flow quantity is larger than 0.7 SCCM, corresponding to a flow quantity of 30% of $Cl_2$, the etching speed is abruptly retarded, thereby no practical etching speed is obtained. In a case of InGaAs, the etching speed is further retarded relative to GaAs, thereby presenting the same tendency.

As described above, in the dry etching method according to the second embodiment, by employing ECR etching and further employing a $Cl_2/He/O_2$ mixture that is obtained by diluting $Cl_2$ gas with He gas, adding $O_2$ gas in an amount below 30% of $Cl_2$ gas, and making the gas pressure below $5.0\times10^{-4}$ Torr, dry etching is performed to the upper layer compound semiconductor including no Al selectively relative to the lower layer compound semiconductor including Al, thereby enabling high selectivity etching.

Embodiment 3

FIGS. 14(a)–14(f) are cross-sectional views showing respective process steps in a production method of semiconductor device according to a third embodiment of the present invention.

In the figure, reference numeral 21 designates a semi-insulating GaAs substrate. An undoped GaAs layer 22 is disposed on the semi-insulating GaAs substrate 21. An n type AlGaAs layer having an Al concentration above 0.2 is disposed on the undoped GaAs layer 22. An n type InGaAs layer 24 having an In composition of above 0.5 is disposed on the n type AlGaAs layer 23. Reference numeral 25 designates first photoresist and reference numeral 26 designates second photoresist. A source and drain electrode 27 are disposed on the n type InGaAs layer 24 and a gate electrode 28 is disposed in the recess produced in the n type AlGaAs layer 23.

A description is given of the production process of this third embodiment.

First of all, on the semi-insulating GaAs substrate 21 an undoped GaAs layer 22, an n type AlGaAs layer 23 having an Al concentration above 0.2, and an n type InGaAs layer 24 having an In concentration above 0.5 are successively produced by MOCVD.

Figure 14A:
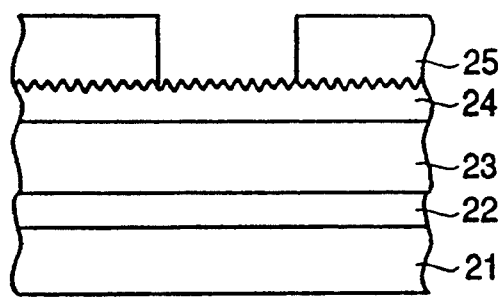
FIGS. 14(a)-14(f) are diagrams illustrating respective steps of a production process according to a third embodiment of the present invention.
Figure 14D:
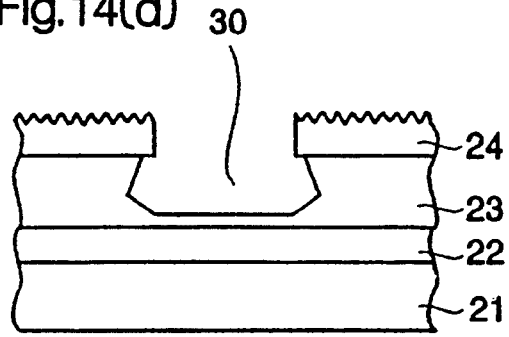
Figure 14B:
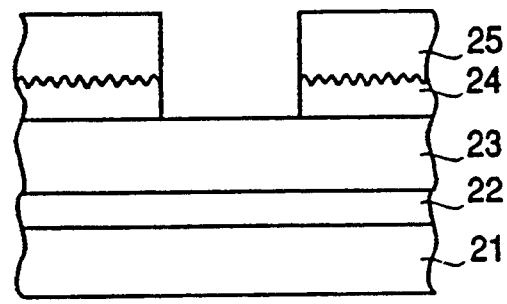

Further, first photoresist 25 is deposited thereon as shown in FIG. 14(a), and patterned as shown in FIG. 14(b).

Next, using the first photoresist 25 as a mask, the InGaAs layer 24 is etched by electron cyclotron resonance etching using a gas mixture including at least $Cl_2$ and $O_2$. Then, when the lower layer n type AlGaAs layer 23 is exposed, oxides of Al are produced at the surface, and thereby ECR etching using $Cl_2$ and $O_2$ is stopped. By this function, the InGaAs layer 24 can be selectively etched relative to the lower layer AlGaAs layer 23, thereby surface roughness after the etching is suppressed.

Next, the n type AlGaAs layer 23 is etched by wet etching using, for example, $NH_4OH$: $H_2O_2$, thereby producing a recess 30 (FIG. 14(c)).

Figure 14E:
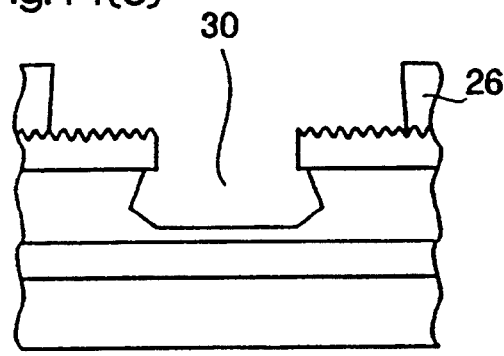
Figure 14C:
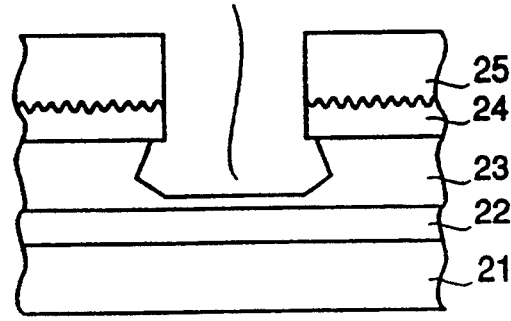
Figure 14F:
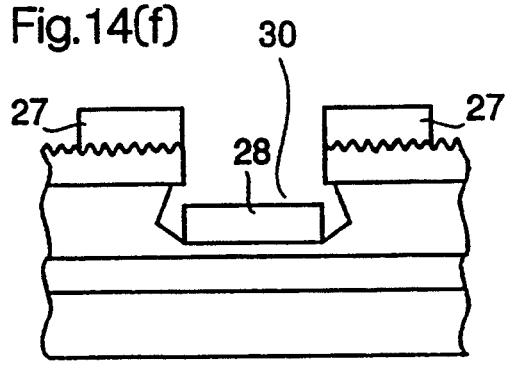
Figure 15A:
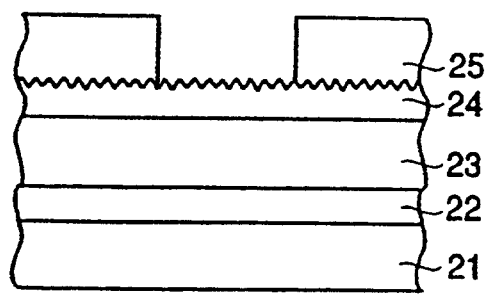
FIGS. 15(a)-15(f) are diagrams showing respective steps of a prior art production method.
Figure 15D:
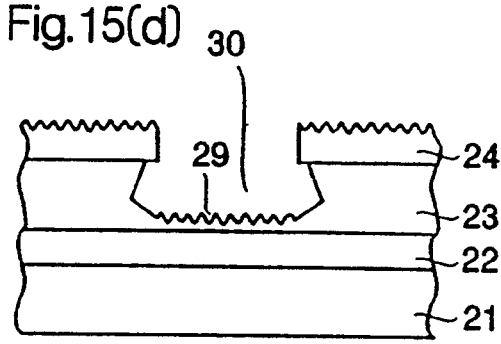
Figure 15B:
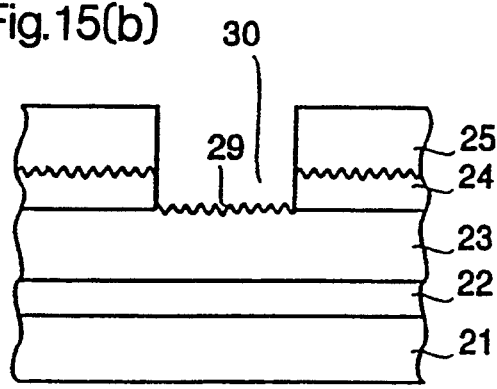
Figure 15E:
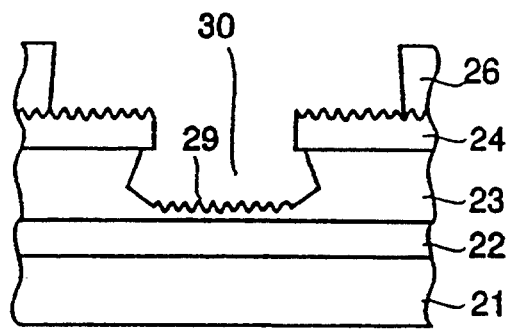
Figure 15C:
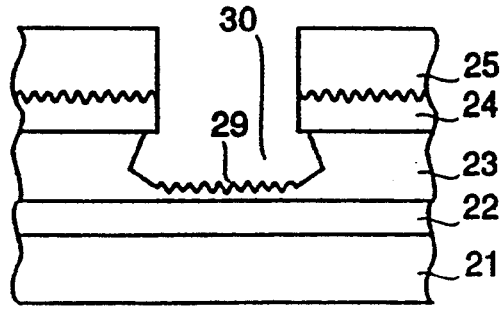
Figure 15F:
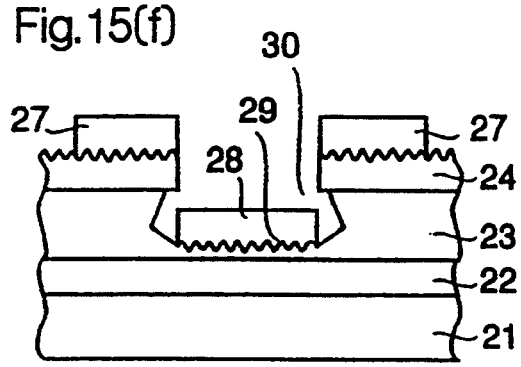

Further, the first photoresist 25 is removed (FIG. 14(d)) and the second photoresist 26 is deposited patterned (FIG. 14(e)).

Further, a metal forming a Schottky junction with the n type AlGaAs layer 23, for example, Ti/Mo/Au is evaporated, and thereafter it is lifted off, thereby producing a source and drain electrode 27 and a gate electrode 28 in the recess 30. In this example, the source and drain electrode 27 and the gate electrode 28 are produced at the same time with the same multi layer metal film, but these may be produced by different metal films in different processes.

In this third embodiment, since the InGaAs layer 24 is selectively etched relative to the lower layer AlGaAs layer 23 using a mixture of $Cl_2$ and $O_2$, the underlying layer including Al produces oxides of Al at its surface, and the etching rate is reduced, thereby selectively etching the InGaAs layer 24, and preventing surface roughness after the etching. Meanwhile, because it is not required to improve the surface morphology of the InGaAs layer, there arises no problems, such that the In composition of InGaAs layer cannot be larger than 0.5 or that the growth temperature is subjected to restrictions, whereby an electrode can be produced on a smooth etched surface of n type InGaAs layer with an In concentration ratio above 0.5.

According to a first embodiment of the present invention, since a selective dry etching method includes employing ECR etching, dry etching an In series compound semiconductor employing a $Cl_2/He$ mixture with a $Cl_2/(He+Cl_2)$ ratio of which is within 0.05 to 0.2 and a gas pressure which is below $4.0\times10^{-4}$ Torr, etching of the In series compound semiconductor to produce a good surface morphology and low damage is achieved.

According to a second embodiment of the present invention, since a selective dry etching method includes employing ECR etching, a dry etching an upper layer compound semiconductor including no Al selectively relative to a lower layer compound semiconductor including Al, employing a $Cl_2/He/O_2$ mixture with the ratio of $Cl_2/(He+Cl_2)$ within 0.05 to 0.2, and adding $O_2$ gas in an amount below 30% of the $Cl_2$, at a gas pressure below $5.0 \times 10^{-4}$ Torr, etching having high selectivity relative to a lower layer compound semiconductor including Al is achieved.

According to a third embodiment of the present invention, since a method of producing a field effect transistor having a structure in which an AlGaAs layer having an Al composition ratio of 0.2 or more and an InGaAs layer having an In composition ratio of 0.5 or more successively deposited on an active layer comprising GaAs, includes etching the InGaAs layer selectively relative to the AlGaAs layer by reactive plasma etching employing an etching gas including at least chlorine and oxygen; and etching the AlGaAs layer employing the InGaAs layer as a mask, thereby producing a so that, an electrode can be produced on a smooth etched surface of n type InGaAs layer having In concentration ratio above 0.5. Then, problems that, in order to lower the roughness of the etching surface and to improve the surface morphology of InGaAs layer, the In composition is restricted to below 0.5 and that the growth temperature is subjected to restrictions, do not arise.

What is claimed is:

1. A selective dry etching method for etching compound semiconductors comprising:
   dry etching an In series compound semiconductor material in an electron cyclotron resonance plasma of a $Cl_2/He$ mixture having a $Cl_2/(He+Cl_2)$ ratio from 0.05 to 0.2 and a gas pressure below $4.0 \times 10^{-4}$ Torr.

2. A selective dry etching method for etching compound semiconductors comprising:
   etching a compound semiconductor material in an electron cyclotron resonance plasma of a $Cl_2/He$ mixture having a $Cl_2/(He+Cl_2)$ ratio from 0.05 to 0.2 and $O_2$ in an amount less than 30% of the $Cl_2$ at a gas pressure below $5.0 \times 10^{-4}$ Torr.

3. The selective dry etching method of claim 2 comprising selectively dry etching one of InGaAs disposed on AlGaAs and GaAs disposed on AlGaAs.

4. The selective dry etching method of claim 2 including supplying 10 to 40 W RF power to the plasma.

5. The selective dry etching method of claim 3 including supplying 10 to 40 W RF power to the plasma.

6. A method of producing a field effect transistor having a structure comprising an AlGaAs layer having an Al composition ratio of at least 0.2 and an InGaAs layer having an In composition ratio of at least 0.5 successively disposed on an active layer comprising GaAs comprising:
   etching said InGaAs layer selectively relative to said AlGaAs layer in a reactive plasma of chlorine and oxygen; and
   etching said AlGaAs layer employing said InGaAs layer as a mask, thereby producing a recess.

* * * * *